United States Patent
Sears

(10) Patent No.: US 11,037,753 B2
(45) Date of Patent: Jun. 15, 2021

(54) MAGNETICALLY MICROFOCUSED ELECTRON EMISSION SOURCE

(71) Applicant: KLA-Tencor Corporation, Milpitas, CA (US)

(72) Inventor: Christopher Sears, Fremont, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/450,242

(22) Filed: Jun. 24, 2019

(65) Prior Publication Data

US 2020/0013579 A1    Jan. 9, 2020

Related U.S. Application Data

(60) Provisional application No. 62/693,869, filed on Jul. 3, 2018.

(51) Int. Cl.
| | |
|---|---|
| *H01J 37/143* | (2006.01) |
| *H01J 3/24* | (2006.01) |
| *H01J 3/02* | (2006.01) |
| *H01J 37/28* | (2006.01) |

(52) U.S. Cl.
CPC .......... *H01J 37/143* (2013.01); *H01J 3/027* (2013.01); *H01J 3/24* (2013.01); *H01J 37/28* (2013.01)

(58) Field of Classification Search
CPC .......... H01J 37/143; H01J 37/28; H01J 27/02; H01J 27/022; H01J 27/024; H01J 3/02; H01J 3/021; H01J 3/027; H01J 3/24
See application file for complete search history.

(56) References Cited

U.S. PATENT DOCUMENTS

| | | | | |
|---|---|---|---|---|
| 3,374,386 A | * | 3/1968 | Charbonnier | H01J 1/304 315/382 |
| 4,142,133 A | * | 2/1979 | Balandin | H01J 29/58 313/431 |
| 5,708,327 A | * | 1/1998 | O'Boyle | H01J 1/3042 313/495 |
| 6,392,333 B1 | * | 5/2002 | Veneklasen | H01J 37/073 313/361.1 |
| 7,372,195 B2 | * | 5/2008 | Coyle | H01J 37/065 250/396 R |
| 8,698,094 B1 | * | 4/2014 | Sears | H01J 37/143 250/396 ML |
| 2014/0264019 A1 | | 9/2014 | Adamec | |

(Continued)

FOREIGN PATENT DOCUMENTS

KR    20160102588 A    8/2016

OTHER PUBLICATIONS

International Search Report and Written Opinion dated Oct. 28, 2019 for PCT/US2019/040205.

*Primary Examiner* — David E Smith
(74) *Attorney, Agent, or Firm* — Suiter Swantz pc llo

(57) ABSTRACT

A magnetically microfocused electron emission source apparatus is disclosed. The apparatus may include a magnetic emitter unit, wherein the magnetic emitter unit comprises an emitter. Further, the magnetic emitter unit may include one or more magnetic portions formed from one or more magnetic materials, wherein the one or more magnetic portions of the magnetic emitter unit are configured to generate a magnetic field proximate to a tip of the emitter of the magnetic emitter unit for enhancing focusing of the emitted electrons from the electron emitter.

14 Claims, 7 Drawing Sheets

(56) References Cited

U.S. PATENT DOCUMENTS

2015/0035428 A1 2/2015 Sun et al.
2015/0371810 A1* 12/2015 Guerrera ............... H01J 37/065
    250/396 R
2016/0148782 A1* 5/2016 Agemura ............. H01J 37/244
    250/310

* cited by examiner

MAGNETICALLY MICROFOCUSED ELECTRON EMISSION SOURCE

CROSS-REFERENCE TO RELATED APPLICATION

The present application claims benefit under 35 U.S.C. § 119(e) and constitutes a regular (non-provisional) patent application of U.S. Provisional Application Ser. No. 62/693,869, filed Jul. 3, 2018, entitled MAGNETICALLY MICROFOCUSED ELECTRON EMISSION SOURCE, naming Christopher Sears as inventor, which is incorporated herein by reference in the entirety.

TECHNICAL FIELD

The present invention generally relates to electron emitter units and, in particular, a magnetic electron emitter unit.

BACKGROUND

Scanning electron microscopy (SEM) tools have become powerful tools for material characterization. SEM tools use electrons from electron sources for imaging a sample. Electrons are emitted from the end point of needle-like metal wires, which are often heated to help induce the electron emission. In many electron source designs, a low magnetic field, in the range of 0.1-0.2 tesla (T), positioned a short distance from or surrounding the emitter is used to focus the electrons. These current emitters are comprised of non-ferritic material having no interaction with the magnetic field.

SUMMARY

An apparatus is disclosed, in accordance with one or more embodiments of the present disclosure. In one embodiment, the apparatus includes a magnetic emitter unit. In another embodiment, the magnetic emitter unit comprises an emitter. In another embodiment, the magnetic emitter unit comprises one or more magnetic portions formed from one or more magnetic materials. In another embodiment, the one or more magnetic portions of the magnetic emitter unit are configured to generate a magnetic field proximate to a tip of the emitter of the magnetic emitter unit for enhancing focusing of the emitted electrons from the electron emitter.

An apparatus is disclosed, in accordance with one or more embodiments of the present disclosure. In one embodiment, the apparatus includes an electron source including a magnetic emitter unit. In another embodiment, the magnetic emitter unit comprises an emitter. In another embodiment, the magnetic emitter unit comprises one or more magnetic portions formed from one or more magnetic materials. In another embodiment, the one or more magnetic portions of the magnetic emitter unit are configured to generate a magnetic field proximate to a tip of the emitter of the magnetic emitter unit for enhancing focusing of the emitted electrons from the electron emitter. In another embodiment, the apparatus further includes an electron-optical column including a set of electron-optical elements configured to direct the electron beam onto a sample. In another embodiment, the apparatus includes a detector assembly configured to detect an electron signal from the sample.

A method is disclosed, in accordance with one or more embodiments of the present disclosure. In one embodiment, the method includes emitting a particle beam from a tip of an electron emitter. In another embodiment, the method includes generating a magnetic field proximate to the tip of the electron emitter, with at least one of a magnetic portion of the electron emitter or a magnetic sleeve surrounding the electron emitter, to enhance focusing of the emitted electrons from the electron emitter.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Reference will now be made in detail to the subject matter disclosed, which is illustrated in the accompanying drawings.

Referring generally to FIGS. 1A through 4, a magnetically microfocused electron emission source apparatus and method are described, in accordance with the present disclosure.

Current electron emitters have physical limitations such as size of the magnetic iron or high voltage stand-off distances to conventional methods for forming a magnetic focusing field. The electron-optical properties of the source can be improved by increasing the magnetic field and further confining it to a volume nearer the emitter surface. This can be accomplished by forming at least a portion of the emitter from a magnetic material. Creating a magnetic electron emitter creates a strong magnetic field locally enhanced in the vicinity of the tip, which creates a strong lensing field. Finding a means to further enhance the field strength and confine its volume can have benefits in providing higher current probe beams of good optical quality.

Embodiments of the present disclosure are directed to a magnetically microfocused electron emission source apparatus for generating a beam of electrons. More particularly, the present disclosure is directed to a magnetic emitter unit including one or more magnetic portions, such that the emission from the emitter is enhanced using a very strong magnetic field. Additionally, embodiments of the present disclosure are directed to creating a strong lensing field (e.g., short focal length) using the strong magnetic field generated by the one or more magnetic portions of the magnetic emitter unit. Embodiments of the present disclosure are also directed to an SEM apparatus utilizing the magnetic emitter unit in the electron source.

Figure 1A:
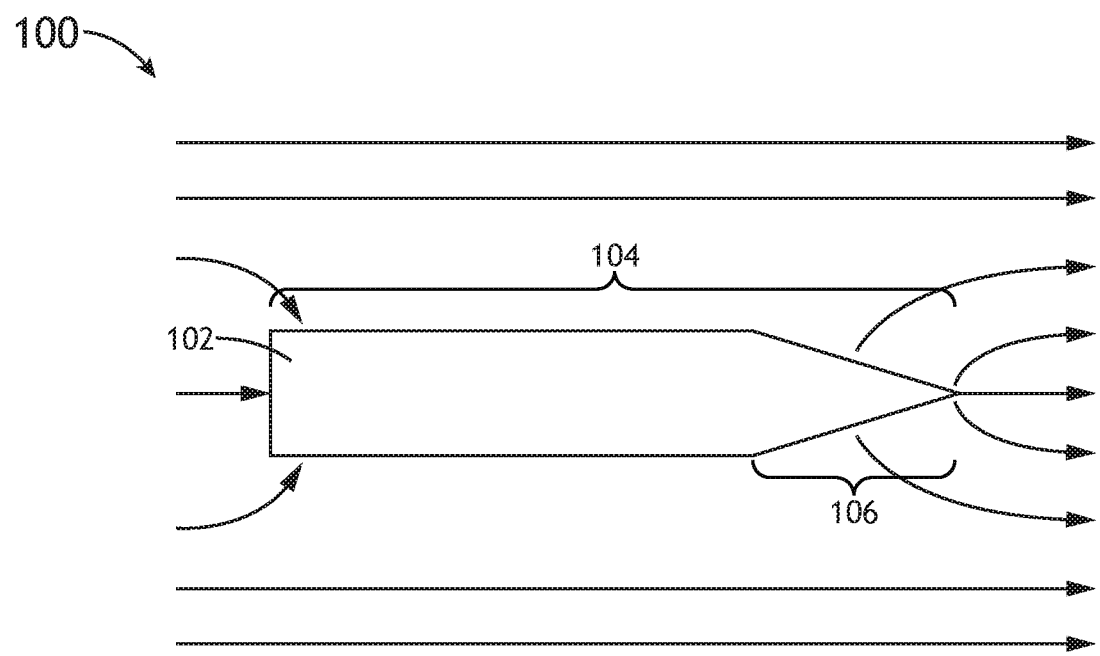
FIG. 1A illustrates a schematic view of a magnetic emitter unit, in accordance with one or more embodiments of the present disclosure.
Figure 1B:
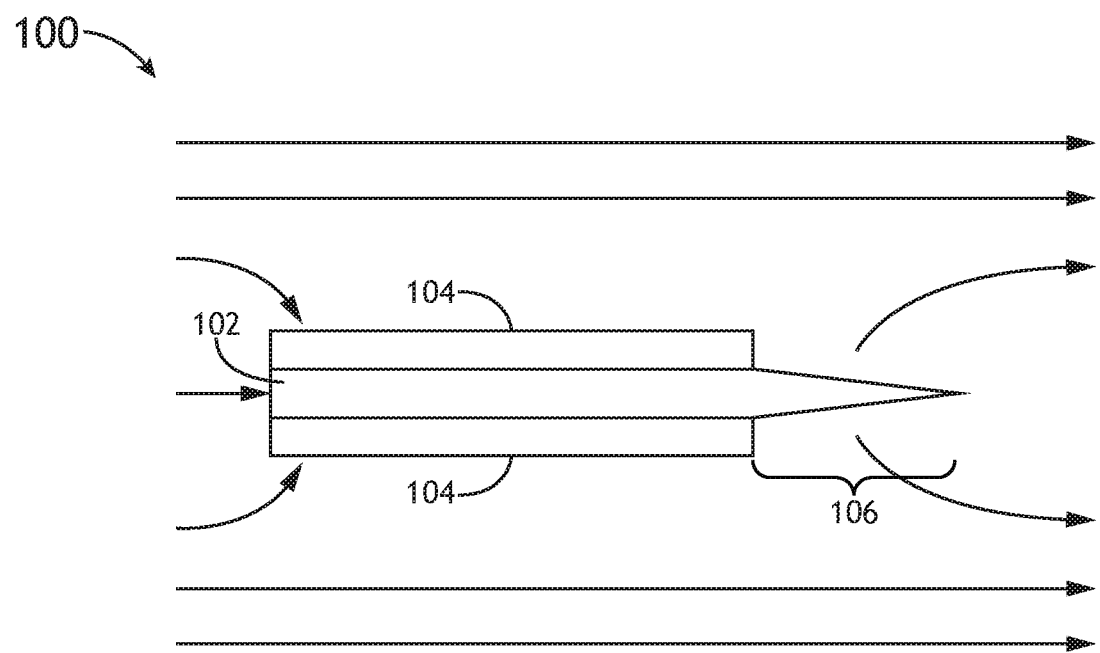
FIG. 1B illustrates a schematic view of a magnetic emitter unit, in accordance with one or more embodiments of the present disclosure.

FIGS. 1A and 1B illustrate schematic views of a magnetic emitter unit 100, in accordance with one or more embodiments of the present disclosure. In one embodiment, the magnetic emitter unit 100 includes an emitter 102. The emitter 102 may include a tip 106. The tip 106 shown in FIGS. 1A and 1B is provided merely for illustrative purposes and shall not be construed as limiting the scope of the present the disclosure. The emitter may 102 have any length and diameter. For example, the emitter may have a length between 1.0-10.0 mm. By way of another example, the emitter may have a diameter between 0.1-2.0 mm.

In another embodiment, the magnetic emitter unit 100 includes one or more magnetic portions 104 arranged on at least a portion of the emitter 102. The one or more magnetic portions 104 may be formed from one or more magnetic materials. The one or more magnetic materials may include any magnetic material known in the art including, but not limited to, one or more ferritic materials. For example, the one or more ferritic materials may include at least one of nickel (Ni), iron (Fe), cobalt (Co), or the like.

Referring to FIG. 1A, in one embodiment, the magnetic emitter unit 100 includes a magnetic emitter (e.g., the emitter 102) formed from one or more magnetic materials. In this embodiment, the one or more magnetic portions 104 may form the magnetic emitter (e.g., the emitter 102).

Referring to FIG. 1B, in another embodiment, the magnetic emitter unit 100 includes a magnetic sleeve structure (e.g., the one or more magnetic portions 104). The magnetic sleeve structure (e.g., the one or more magnetic portions 104) may surround a portion of the emitter 102, such that the tip 106 of the emitter 102 is not covered with the one or more magnetic materials. In this embodiment, the one or more magnetic materials may include any magnetic material known in the art including, but not limited to, one or more ferritic materials (e.g., Ni, Fe, Co, or the like). In this embodiment, the emitter 102 may be formed from any non-magnetic material known in the art, including, but not limited to, at least one of aluminum (Al), cooper (Cu), lead (Pb), titanium (Ti), zinc (Zn), tungsten (W), ruthenium (Ru), carbon (C) nanowire, lanthanum hexabromide ($LaB_6$), cerium hexaboride ($CeB_6$), or the like. The emitter 102 including the magnetic sleeve structure may have any length and diameter known in the art. For example, the emitter 102 including the magnetic sleeve may have a length between 1.0-10.0 mm. By way of another example, the emitter 102 including the magnetic sleeve may have a diameter between 1.0-3.0 mm.

It is noted herein that the magnetic sleeve structure (e.g., the one or more magnetic portions 104) may be connected to the emitter 102 using any fabrication process known in the art. For example, the magnetic sleeve structure may be friction fit to the emitter 102. For instance, the magnetic sleeve structure 104 may be connected to the emitter 102 by cooling the inner emitter 102 and/or heating the outer magnetic sleeve structure 104 and then placing the emitter 102 inside the magnetic sleeve structure 104 and allowing the assembly to come to equilibrium. By way of another example, the magnetic sleeve structure may be spot welded to the emitter 102.

In another embodiment, the one or more magnetic portions 104 of the magnetic emitter unit 100 are configured to generate a magnetic field proximate to the tip 106 of the emitter 102 for enhancing particle emission from the tip 106 of the emitter 102. For example, the one or more magnetic portions 104 of the magnetic emitter unit 100 are configured to generate a magnetic field proximate to the tip 106 of the emitter 102 to enhance focusing of the emitted electrons from the electron emitter 102. The magnetic field lines shown in FIGS. 1A and 1B are provided merely for illustrative purposes and shall not be construed as limiting the scope of the present disclosure.

In another embodiment, the magnetic field generated by the magnetic emitter unit 100 is configured to generate a lensing field for particle emission from the tip 106 of the emitter 102 of the magnetic emitter unit 100. The lensing field may have any strength known in the art. For example, the lensing field may have a strength between 0.5-2.5 Tesla (T) at a surface of the tip 106 of the emitter 102. For instance, the lensing field may have a strength of 1.5 T.

The particle emission from the tip 106 of the emitter 102 may include any type of emission process known in the art. For example, the particle emission may include at least one of thermal electron emission, Schottky electron emission, extended-Schottky electron emission, cold field electron emission, photoemission, or the like.

Figure 2A:
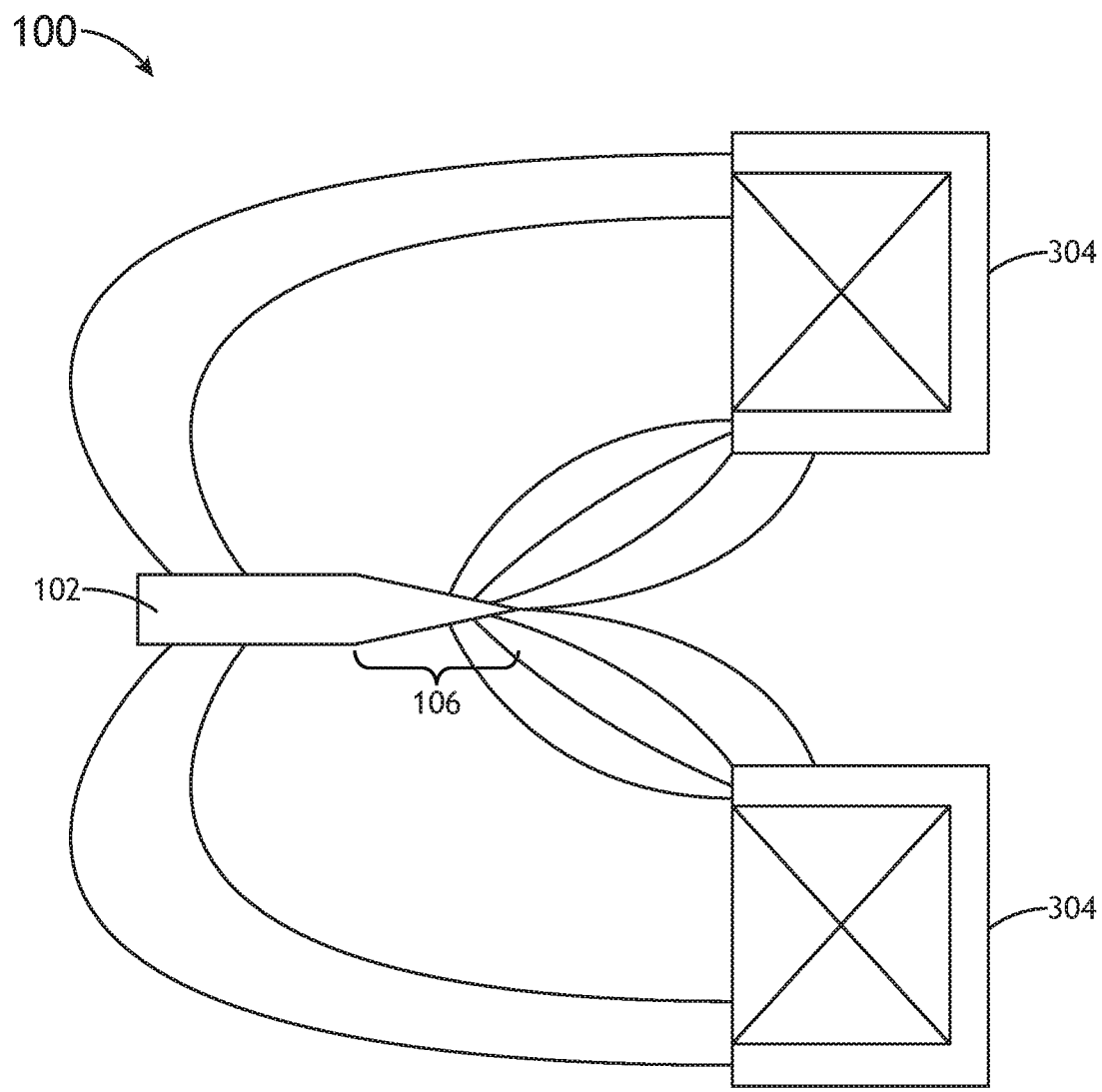
FIG. 2A illustrates a magnetic field generated by a magnetic emitter unit, in accordance with one or more embodiments of the present disclosure.
Figure 2B:
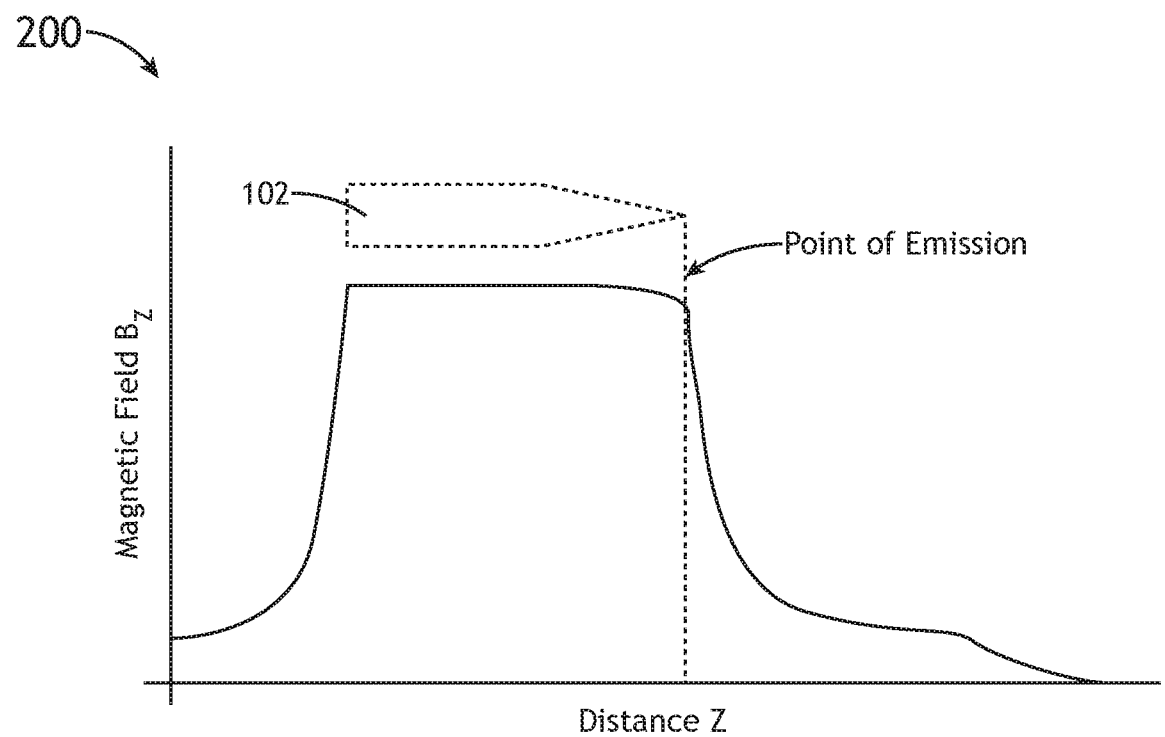
FIG. 2B illustrates a plot of magnetic field strength of the magnetic field shown in FIG. 2A, in accordance with one or more embodiments of the present disclosure.

FIG. 2A illustrates a magnetic field generated by the magnetic emitter unit 100, in accordance with one or more embodiments of the present disclosure. FIG. 2B illustrates a plot 200 of magnetic field strength of the magnetic field shown in FIG. 2A, in accordance with one or more embodiments of the present disclosure. In one embodiment, the magnetic field (BZ) generated by the one or more magnetic portions 104 of the emitter 102 decays rapidly away from the tip 106, as shown by FIGS. 2A and 2B. For example, the one or more magnetic portions 104 of the emitter 102 are configured to focus magnetic flux provided by the larger magnetic circuit into a much more intense local field at or near the power of electron emission (e.g., the one or more magnetic portions 104 of the emitter 102). Applicant notes that if the magnetic field were stronger throughout the entire magnetic emitter unit 100, the electrons would be over focused and would go through many intermediate foci.

Referring to FIG. 2B, the strength of the magnetic field (Bz) is stronger at or near the one or more magnetic portions 104 of the emitter 102. The flat portion of the plot 200, which indicates a relatively constant strong magnetic field and corresponds to the length of the emitter 102 and the tip 106. The plot 200 indicates that the strength of the magnetic field (Bz) decreases rapidly while traveling a distance (Z) away from the tip 106.

Figure 2C:
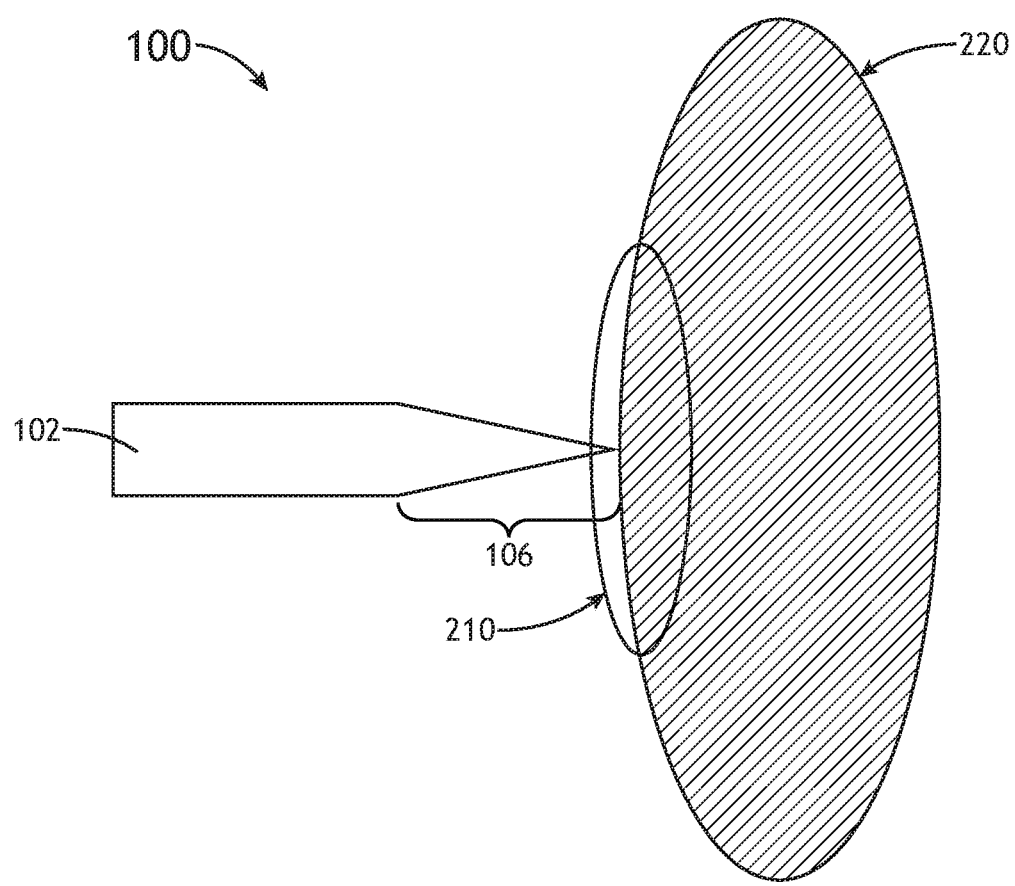
FIG. 2C illustrates a lensing field of a magnetic emitter unit, in accordance with one or more embodiments of the present disclosure.

FIG. 2C illustrates a lensing field 210, 220 of the magnetic emitter unit 100, in accordance with one or more embodiments of the present disclosure. In one embodiment, a strong lensing field 210 is generated by the magnetic emitter unit 100 and is stronger (with short focal length) near the tip 106, while a main magnet of a corresponding electron-optical system (e.g., system 300) creates a weaker lensing field 220 (with long focal length) while traveling further from the tip 106. Further, Applicant notes that by forming a shorter focal length near the tip 106 lens aberrations are reduced.

Figure 3:
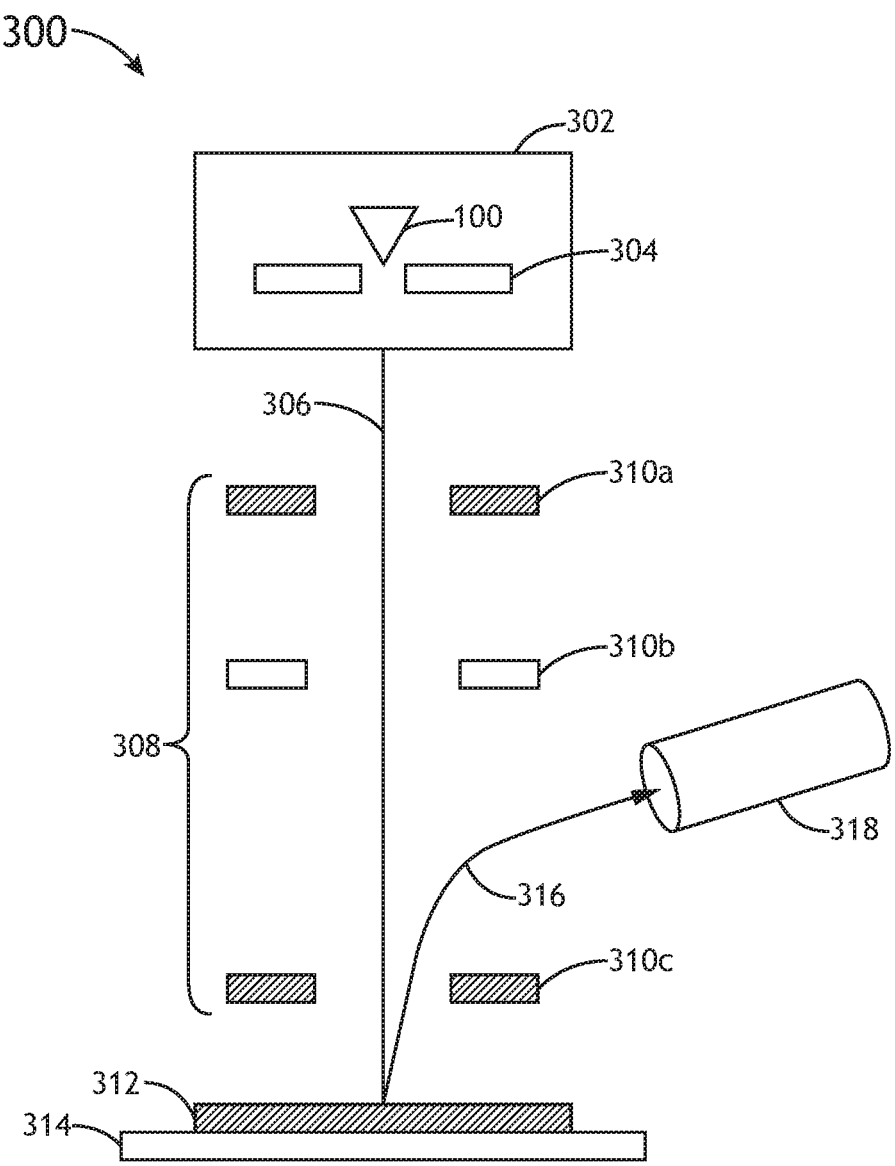
FIG. 3 illustrates a high-level schematic view of a scanning electron microscope (SEM) apparatus, in accordance with one or more embodiments of the present disclosure.

FIG. 3 illustrates a high-level schematic view of a scanning electron microscope (SEM) apparatus 300, in accordance with one or more embodiments of the present disclosure. It is noted herein that the various embodiments, components, and architecture described previously herein with regard to FIGS. 1A through 2C should be interpreted to extend to the SEM apparatus 300 of FIG. 3, unless noted otherwise.

In one embodiment, the SEM apparatus 300 includes an electron source 302 for generating one or more electron beams 306.

In another embodiment, the electron source 302 includes one or more emitters. For example, the electron source 302 may include the magnetic emitter unit 100 shown in FIGS. 1A and 1B. The electron source 302 and the magnetic emitter unit 100 may include any emitter known in the art suitable for emitting one or more electron beams 306. For example, the electron source 302 and the magnetic emitter unit 100 may include a single electron emitter. By way of another example, the electron source 302 and the magnetic emitter unit 100 may include multiple electron emitters.

The electron source 302 and the magnetic emitter unit 100 may include any electron emitter known in the art of electron emission. For example, the electron source 302 and the magnetic emitter unit 100 may include, but are not limited to, one or more field emission guns (FEGs). By way of another example, the one or more field emission guns may include, but are not limited to, a carbon nanotube emitter, a nanostructured carbon film emitter, a Muller-type emitter, a Spindt-type emitter, or a Schottky-type emitter.

In another embodiment, the electron source 302 includes one or more extractors 304 (as shown in FIGS. 2B and 3). During operation, the one or more extractors 304 extract at least a portion of the electron beam 306 from the magnetic emitter unit 100 and transmit the electron beam 306 to an electron-optical column 308, which in turn directs the beam 306 to a sample 312. The one or more extractors 304 of the electron source 302 may include any electron beam extractor known in the art.

In another embodiment, the SEM apparatus 300 includes a sample stage 314. In one embodiment, the sample stage 314 is an actuatable stage. For example, the sample stage 314 may include, but is not limited to, one or more translational stages suitable for selectively translating the sample 312 along one or more linear directions (e.g., x-direction, y-direction and/or z-direction). By way of another example, the sample stage 314 may include, but is not limited to, one or more rotational stages suitable for selectively rotating the sample 312 along a rotational direction. By way of another example, the sample stage 314 may include, but is not limited to, a rotational stage and a translational stage suitable for selectively translating the sample 312 along a linear direction and/or rotating the sample 312 along a rotational direction.

In another embodiment, the SEM apparatus 300 includes an electron-optical column 308 for directing and/or focusing the electron beam 306 onto the sample 312 disposed on the sample stage 314. The sample 312 may include any sample known in the art suitable for inspection/review with electron-beam microscopy (e.g., SEM). In one embodiment, the sample 312 includes a wafer. For example, the sample 312 may include, but is not limited to, a semiconductor wafer. As used through the present disclosure, the term "wafer" refers to a substrate formed of a semiconductor and/or a non-semiconductor material. For instance, a semiconductor or semiconductor material may include, but is not limited to, monocrystalline silicon, gallium arsenide, and indium phosphide. In another embodiment, the sample includes a photomask. In another embodiment, the sample 312 includes a reticle. In another embodiment, the sample 312 emits and/or scatters electrons 316 in response to the one or more electron beams 306.

In another embodiment, the electron-optical column 308 includes a set of electron-optical elements 310a-310c configured to direct the electron beam onto the sample 312. The set of electron-optical elements 310a-310c may include any combination of electron-optical elements known in the art. For example, the set of electron-optical elements 310a-310c may include one or more condenser lenses 310a. By way of another example, the set of electron-optical elements 310a-310c may include one or more objective lenses 310c. The one or more condenser lenses 310a and one or more objective lenses 310c may include any lens technology known in the art of electron-optics capable of shaping the electron beam 306 and/or the electron signal 316. By way of a further example, the set of electron-optical elements 310a-310c may include one or more beam deflector units 310b (e.g., quadrupole deflectors or octupole deflectors).

In another embodiment, the SEM apparatus 300 includes a detector assembly 318 configured to detect an electron signal 316 from the sample 312. The detector assembly 318 includes any detector technology known in the art capable of detecting an electron signal 316 from the sample 312 (e.g., secondary electrons and/or backscattered electrons). For example, a secondary electron detector may include an electron collector, which collects secondary electrons 316 emitted by the surface of the sample 312. Further, the electron detector assembly 318 may include a detector for detecting the secondary electrons 316. For instance, the electron detector assembly 318 may include, but is not limited to, an Everhart-Thornley detector. By way of another example, the detector element may include, but is not limited to, a scintillating element and photomultiplier tube (PMT) detector. In another embodiment, the detector assembly 318 may include one or more of micro-channel plate (MCP), a PIN or p-n junction detector, such as a diode or a diode array or one or more avalanche photo diodes (APDs).

Figure 4:
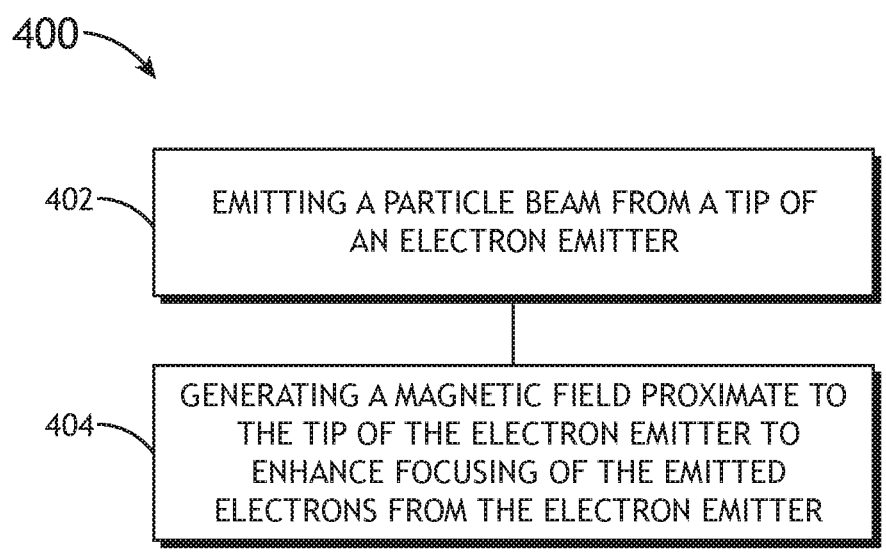
FIG. 4 illustrates a process flow diagram of a method for implementing a magnetic emitter unit, in accordance with one or more embodiments of the present disclosure.

FIG. 4 is a process flow diagram illustrating a method 400 of implementing a magnetic emitter unit 100, in accordance with one or more embodiments of the present disclosure. It is noted herein that the various embodiments, components, and architecture described previously herein in FIGS. 1A though 3 should be interpreted to extend to the method 400 of FIG. 4.

In a step 402, a particle beam from a tip 106 of an electron emitter 102 is emitted by the magnetic emitter unit 100.

In a step 404, a magnetic field proximate to the tip 106 of the electron emitter 102 is generated to enhance focusing of the emitted electrons from the electron emitter 102.

During operation, the magnetic emitter unit 100 emits the one or more electron beams 306. The one or more extractors 304 extract a portion of the one or more electron beams 306 and transmit through the electron-optical column 308. The set of electron-optical elements 310a-310c direct and/or focus the one or more electron beams 306 on the sample 312 disposed on the sample stage 314. The sample 312 then emits the electron signal 316 which is detected by the detector assembly 318 of the SEM apparatus 300.

One skilled in the art will recognize that the herein described components, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, devices, and objects should not be taken as limiting.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. An apparatus comprising:
   a magnetic emitter unit, wherein the magnetic emitter unit comprises an emitter and a magnetic sleeve structure surrounding the emitter and in mechanical contact with the emitter, wherein the emitter is formed from a non-magnetic material, the magnetic sleeve structure is configured to generate a magnetic field proximate to a tip of the emitter of the magnetic emitter unit for enhancing focusing of the emitted electrons from the emitter.

2. The apparatus of claim 1, wherein the magnetic field generated by the magnetic emitter unit is configured to generate a lensing field for particle emission from the tip of the emitter of the magnetic emitter unit.

3. The apparatus of claim 2, wherein the lensing field has a strength between 0.5-2.5 Tesla at a surface of the tip of the emitter.

4. The apparatus of claim 1, wherein the particle emission from the tip of the emitter comprises:
   at least one of thermal electron emission, Schottky electron emission, extended-Schottky electron emission, cold field electron emission, or photoemission.

5. The apparatus of claim 1, wherein the magnetic sleeve structure is formed from at least one of nickel, iron, or cobalt.

6. An apparatus comprising:
   an electron source including a magnetic emitter unit, wherein the magnetic emitter unit comprises an emitter and a magnetic sleeve structure surrounding the emitter and in mechanical contact with the emitter, wherein the emitter is formed from a non-magnetic material, the magnetic sleeve structure is configured to generate a magnetic field proximate to a tip of the emitter of the magnetic emitter unit for enhancing focusing of the emitted electrons from the emitter;

an electron-optical column including a set of electron-optical elements configured to direct an electron beam onto a sample; and a detector assembly configured to detect an electron signal from the sample.

7. The apparatus of claim 6, wherein the magnetic field generated by the magnetic emitter unit is configured to generate a lensing field for particle emission from the tip of the emitter of the magnetic emitter unit.

8. The apparatus of claim 7, wherein the lensing field has a strength between 0.5-2.5 Tesla at a surface of the tip of the emitter.

9. The apparatus of claim 6, wherein the particle emission from the tip of the emitter comprises:

at least one of thermal electron emission, Schottky electron emission, extended-Schottky electron emission, cold field electron emission, or photoemission.

10. The apparatus of claim 6, wherein the magnetic sleeve structure is formed from at least one of nickel, iron, or cobalt.

11. The apparatus of claim 6, wherein the apparatus comprises a scanning electron microscopy system.

12. The apparatus of claim 6, wherein the apparatus comprises at least one of an inspection system or imaging-based metrology system.

13. A method comprising:

emitting a particle beam from a tip of an electron emitter surrounded by a magnetic sleeve structure in mechanical contact with the electron emitter; and generating a magnetic field proximate to the tip of the electron emitter with the magnetic sleeve structure surrounding the electron emitter to enhance focusing of the emitted electrons from the electron emitter.

14. The method of claim 13, wherein the magnetic sleeve structure is formed from at least one of nickel, iron, or cobalt.

* * * * *